United States Patent
Hansal et al.

(10) Patent No.: US 11,060,925 B2
(45) Date of Patent: Jul. 13, 2021

(54) MAGNETIC FORCE SENSOR AND PRODUCTION THEREOF

(71) Applicant: HIRTENBERGER ENGINEERED SURFACES GMBH, Hirtenberg (AT)

(72) Inventors: Wolfgang Hansal, Markt Piesting (AT); Selma Hansal, Markt Piesting (AT); Rudolf Mann, Vienna (AT); Martina Halmdienst, Natschbach (AT)

(73) Assignee: HIRTENBERGER ENGINEERED SURFACES GMBH, Hirtenberg (AT)

( * ) Notice: Subject to any disclaimer, the term of this patent is extended or adjusted under 35 U.S.C. 154(b) by 0 days.

(21) Appl. No.: 16/481,004

(22) PCT Filed: Jan. 26, 2018

(86) PCT No.: PCT/AT2018/060025
§ 371 (c)(1),
(2) Date: Jul. 25, 2019

(87) PCT Pub. No.: WO2018/136988
PCT Pub. Date: Aug. 2, 2018

(65) Prior Publication Data
US 2020/0003633 A1 Jan. 2, 2020

(30) Foreign Application Priority Data
Jan. 27, 2017 (AT) .............. A 50057/2017

(51) Int. Cl.
*G01L 1/00* (2006.01)
*G01L 1/12* (2006.01)
*G01R 33/00* (2006.01)

(52) U.S. Cl.
CPC .......... *G01L 1/122* (2013.01); *G01R 33/0029* (2013.01); *G01R 33/0035* (2013.01)

(58) Field of Classification Search
CPC . G01L 1/122; G01R 33/0029; G01R 33/0035; G01R 33/063; G01R 15/207;
(Continued)

(56) References Cited

U.S. PATENT DOCUMENTS

| 2,231,702 A | 2/1939 | Burgwin et al. |
| 4,255,708 A | 3/1981 | Wilson, III |

(Continued)

FOREIGN PATENT DOCUMENTS

| DE | 36 24 846 A1 | 1/1988 |
| DE | 100 23 838 A1 | 12/2001 |

(Continued)

OTHER PUBLICATIONS

International Search Report cited in PCT/AT2018/060025, dated Sep. 4, 2018.
(Continued)

*Primary Examiner* — Max H Noori
(74) *Attorney, Agent, or Firm* — Workman Nydegger

(57) ABSTRACT

The invention relates to a magnetic force sensor (100), having at least one conducting track (111, 211) of soft magnetic material, wherein the at least one conducting track (111, 211) has at least one interruption (130) having a distance (A), wherein the force sensor (100) is arranged on a substrate, in particular on a component (1, 2) to be monitored, and a change in the distance (A) or rather a change in the magnetic flux in the at least one magnetic conducting track (111, 211) is monitored.

17 Claims, 3 Drawing Sheets

(58) Field of Classification Search
CPC ............. H01F 1/14708; H01F 1/14716; H01F 1/15308
USPC ........................................................ 73/862.69
See application file for complete search history.

(56) References Cited

U.S. PATENT DOCUMENTS

| | | | |
|---|---|---|---|
| 4,976,160 A | 12/1990 | Dobler et al. | |
| 5,036,236 A | 7/1991 | Wilson | |
| 5,313,845 A * | 5/1994 | Hayashi | G01L 3/102 324/209 |
| 5,699,214 A * | 12/1997 | Kano | B82Y 10/00 324/207.2 |
| 6,163,148 A * | 12/2000 | Takada | G01L 3/101 324/226 |
| 6,823,746 B2 | 11/2004 | Viola et al. | |
| 9,989,429 B2 | 6/2018 | Matysik et al. | |
| 2003/0128418 A1* | 7/2003 | Sugawara | H01F 1/10 359/280 |
| 2006/0215315 A1* | 9/2006 | Miyake | G11B 5/3113 360/125.33 |
| 2010/0231204 A1* | 9/2010 | Tenbrink | C22C 19/057 324/207.13 |
| 2016/0176702 A1 | 6/2016 | Pagani et al. | |
| 2017/0074907 A1* | 3/2017 | Grno | H01F 38/40 |

FOREIGN PATENT DOCUMENTS

| | | |
|---|---|---|
| DE | 103 31 128 A1 | 1/2004 |
| DE | 10 2014 200 461 A1 | 7/2015 |
| EP | 012325 | 12/1979 |
| EP | 0 012 325 | 6/1980 |
| GB | 872 887 | 7/1961 |
| WO | WO 2012/116933 | 9/2012 |

OTHER PUBLICATIONS

Dezuari, O., et al, "Printed circuit board integrated fluxgate sensor" Sensors and Actuators 81 (2000) 200-203.
Written Opinion issued in PCT/AT2018/060025, dated Apr. 9, 2018.
International Search Report issued in PCT/AT2018/060025, dated Sep. 4, 2018.

* cited by examiner

MAGNETIC FORCE SENSOR AND PRODUCTION THEREOF

The invention relates to a magnetic force sensor having at least one conducting track of soft magnetic material, wherein the at least one conducting track has at least one interruption having a distance, and to a manufacturing method for producing the magnetic force sensor.

The measurement of physical quantities on components of, for example, vehicles and aircraft, machines or buildings is an essential element for their maintenance and operations monitoring. An important factor in this connection is the force acting on a component, the measurement of which provides important information about the load or the overall condition of the component.

The method which is currently most commonly used consists in the measurement of deformations and the forces arising thereby by means of strain gauges attached to appropriate spots of the component. A major disadvantage of this system is that those strain gauges are glued to the component to be measured, with this bonding affecting the transmission of the measured information, possibly falsifying it. Furthermore, the strain gauge must be electrically contacted so that the measured information can be read out, wherein it is necessary for metallic components to completely isolate the electrical measuring circuit from the component.

Therefore, methods have become known wherein the measurement of deformations of a component is conducted by magnetic means.

For example, DE 10 2014 200 461 A1 describes an arrangement for measuring a force or a torque on a machine element with a permanent magnetization along a closed magnetization path. For this, a magnetic field sensor is provided which monitors a change in the magnetic field. This arrangement is not suitable for all components, since it requires a permanent magnetization of the component at least in a certain area. It is also susceptible to faults with regard to magnetic and/or electrical or, respectively, electromagnetic influences from the outside.

In DE 36 24 846 A1, a device for contactless measurement of a mechanical stress, in particular for measuring the torsion or bending force of a measured object, is described. For this purpose, two regions comprising a layer of magnetoelastic material, which has a stripe pattern formed at an angle of 45°, are arranged on a shaft. A change in this layer pattern when the shaft is under mechanical stress is monitored using a complex evaluation circuit.

Another magnetoelastic torque sensor can also be found in DE 103 31 128 A1.

U.S. Pat. No. 5,036,236 A discloses a proximity sensor based on magnetic fields, wherein the sensor comprises a magnetic conductor having an interruption serving as a reference for the distance between two components of magnetic material moving toward each other.

The above-mentioned arrangements are only partially, or not at all, suitable for monitoring deformation processes on a component or have a complex structure which, in practice, is not very suitable.

It is therefore the object of the invention to provide a magnetic force sensor which is suitable for monitoring deformation processes on a component made also of non-magnetic material, wherein the sensor can be arranged at arbitrary spots of the component to be monitored.

According to the invention, this object is achieved in that the force sensor according to the invention is arranged on a substrate, preferably directly on the component to be monitored, wherein a change in the distance of the interruption of the at least one magnetic conducting track is monitored. In a first embodiment of the invention, the force sensor according to the invention has a particularly simple structure and can be arranged on any desired ground.

In this case, the magnetic flux in the at least one magnetic conducting track is monitored, wherein a change in the distance of the at least one magnetic conducting track causes a change in the magnetic flux in the at least one magnetic conducting track. In case of a possible deformation of the component to be monitored due to forces acting on it, the distance of the at least one interruption of the at least one magnetic conducting track changes. This, however, changes the magnetic field induced in the interruption of the at least one magnetic conducting track, whereby the magnetic flux in the at least one magnetic conducting track changes in turn. This change in the magnetic flux is thus an indicator of a deformation of the component to be monitored.

Different processes can be used as measuring methods for a change in the magnetic flux, namely inductive ones, those according to the fluxgate principle, those via the anisotropic magnetic resistance or those using magnetoimpedance.

If the measurement of the flux change is conducted inductively, rapid flux changes can be measured in this case, this method being unsusceptible to slow changes which occur gradually. Furthermore, absolute magnetic flux values cannot be determined by this method.

With the anisotropic magnetoresistive effect, the electric resistance of a ferromagnetic material changes with its magnetization, wherein this change in resistance can be measured.

The magnetoimpedance effect is based, on the one hand, on the change in the differential permeability of a soft magnetic substance as a function of the magnetization thereof, and on the so-called skin effect due to which the current in a conductor is forced through its own magnetic field toward the surface at high frequencies. Combined, those effects cause the AC resistance of a soft magnetic conductor to be highly dependent on an external magnetic field; this effect can be observed particularly well at frequencies in the MHz range.

Fluxgate sensors are able to precisely measure small magnetic fluxes, this type of measurement being more complex, as the measuring sections must be surrounded by coils for this purpose.

Each of those measuring methods is suitable for detecting the change in the distance of the at least one interruption in the at least one conducting track of the magnetic measuring circuit.

Preferably, the measured value for the magnetic flux is permanently compared to a predefinable threshold value in an evaluation unit, and upon reaching this threshold value, a signal is emitted. This signal serves as a warning signal when the component to be monitored deforms, whereby the change in the distance of the at least one interruption in the magnetic conducting track is induced.

According to the invention, it is provided in a first embodiment of the invention that the substrate consists of an insulating material, e.g., plastic, ceramic, glass, sapphire or mica. In this case, the force sensor according to the invention is applied to this substrate, for example, by means of electrodeposition, and the substrate is, in turn, arranged on the component to be measured.

As an alternative, it is provided in a particularly preferred variant that the force sensor is applied directly to the component, in particular by means of electrodeposition. In this case, it may be provided that the force sensor is provided with a magnetic barrier layer of non-magnetic material in order to isolate the force sensor according to the invention from a magnetizable component, thus protecting it from interfering influences.

In order to produce a magnetic flux in the force sensor, at least one excitation magnet is provided in a particularly preferred embodiment of the invention. Said magnet may be a permanent magnet, which preferably is also produced by means of electrodeposition. For this purpose, a hard magnetic alloy is deposited, or permanently magnetic particles may also be incorporated in a non-magnetic matrix. As an alternative, the excitation magnet may also be an electromagnet.

Preferably, it is provided that the magnetic flux in the at least one conducting track is induced by at least one excitation magnet, which is preferably in direct contact with the at least one magnetic conducting track. Alternatively, however, the at least one excitation magnet can be formed also outside of the force sensor, for example as part of the component to be monitored or as an additional element in the region of the component to be monitored.

The force sensor according to the invention is preferably provided with at least one measuring device for monitoring the magnetic flux within the at least one conducting track. In this manner, an integral measuring sensor is obtained without the need for an additional external measuring unit.

In this connection, it is particularly preferably provided that the at least one measuring device is designed as a measuring chip with at least one, preferably two, internal magnetic measuring sections, the measuring chip preferably being arranged on an electrically insulating carrier, e.g., plastic, ceramic, glass, sapphire or mica. Said measuring chip analyses the changes in the magnetic flux and transmits the obtained data to an (external) evaluation unit.

In a particularly preferred embodiment of the invention, it is provided that the at least one magnetic conducting track with the at least one interruption and the at least one measuring device form a magnetic measuring circuit. In this case, the at least one excitation magnet is advantageously also part of said magnetic measuring circuit. Alternatively, the at least one excitation magnet can be arranged outside of the force sensor.

In interference-prone environments, it may be necessary to compensate for external effects such as stray fields or temperature fluctuations that affect the magnetic flux independently of a force. For this purpose, a second magnetic circuit, namely a magnetic compensation circuit preferably with at least one further excitation magnet, is provided. The adjustment of the magnetic resistance of the compensation circuit can optionally be achieved by influencing the permeability of the magnetic conductor during the production, namely the deposition, for example by varying the pulse pattern used for the deposition, by geometric variations such as layer thickness and/or conductor width, by introducing an additional interruption of the magnetic conductor of the compensation circuit at a suitable location or by a combination of those measures.

The at least one measuring device, in particular the measuring chip, connects the two magnetic circuits, namely the at least one measuring circuit and the at least one compensation circuit, preferably via a Wheatstone bridge. This design allows even the smallest changes in the magnetic flux to be measured accurately.

The force sensor according to the invention is used in particular for the determination of deformations of components.

The production of the force sensor according to the invention is effected by means of a manufacturing method wherein at least one magnetic conducting track having at least one interruption is applied to a substrate, preferably to a component to be monitored, involving a distance, wherein the application is effected particularly preferably by means of electrodeposition.

In doing so, a soft magnetic alloy, e.g., a nickel-iron alloy of an optimized composition, is applied to a preferably non-magnetic, optionally masked component by galvanic means. In this case, the interruption with a defined distance, which is required for the measurement, either is created already in the masking or is incorporated after the coating, for example using a laser.

If the ground on which the force sensor is applied is magnetic, e.g., made of steel or cast iron, a non-magnetic layer must be applied to the base material prior to the application of the conducting tracks. This non-magnetic layer is, for example, a layer of copper, tin, zinc, which has also been produced galvanically, or an alloy of two or more of those elements or else also of a non-magnetic alloy of iron metals with phosphorus. Due to this fully metallic structure, an optimum connection of the sensor to the component is obtained without, for example, an additional adhesive layer for applying the sensor to the component to be measured being able to influence the measurement results.

The galvanic production of the excitation magnets, which are particularly suitable for the force sensor according to the invention, can be accomplished in two different ways.

In one variant, a permanently magnetic alloy selected from a group comprising alloys such as cobalt-nickel-phosphorus, cobalt-nickel-manganese-phosphorus, cobalt-nickel-rhenium-phosphorus, iron-platinum, cobalt-platinum and bismuth-manganese, is electrodeposited on the substrate or, respectively, component.

As an alternative, permanently magnetic micro- or nanoparticles are incorporated into a non-magnetic, metallic matrix during the electrodeposition on the substrate, in particular the component. In this case, all hard magnetic materials are suitable as particles, just as hard magnetic alloys in a suitable form, e.g., as nanowires, as powders such as, e.g., ferrites, chromium dioxide, iron oxide, neodymium-iron-boron powder or cobalt-samarium powder. Those particles can be used either in pure form or following a suitable chemical surface modification, for example with siloxanes. On the one hand, the chemical modification of the surface of the particles serves for the control of the incorporation rate of the particles into the galvanic layer, on the other hand, the chemical stability against the electrolyte used for the deposition can thereby be increased.

Preferably, the deposition of the permanently magnetic layer occurs in a magnetic field applied from the outside, which aligns the particles in their direction of magnetization and thus increases the resulting field strength of the electrodeposited permanent magnet.

For special requirements, it is possible to perform the deposition of the permanently magnetic layer in several phases and to change the direction of the external magnetic field between the phases. In this way, permanently magnetic layers with a locally varying magnetization can be produced.

The invention is explained in further detail below on the basis of non-limiting exemplary embodiments with associated figures. Therein:

Figure 1:
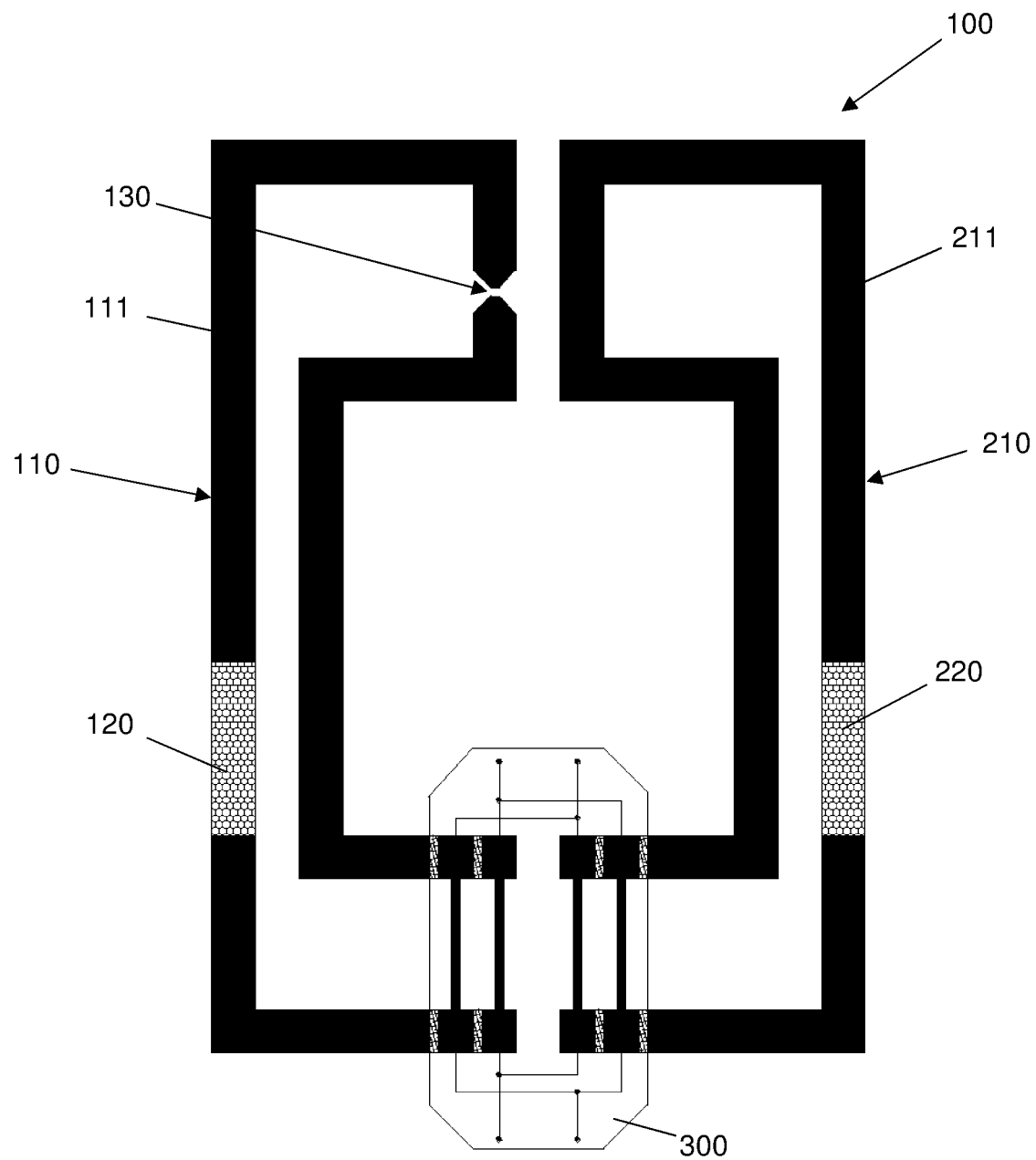
FIG. 1 shows a schematic view of a first embodiment of the force sensor according to the invention.

In FIG. 1, a first particularly preferred embodiment of the force sensor 100 according to the invention is depicted. This force sensor 100 comprises a magnetic measuring circuit 110 with a magnetic conducting track 111 in which a first excitation magnet 120 is arranged.

Figure 2:
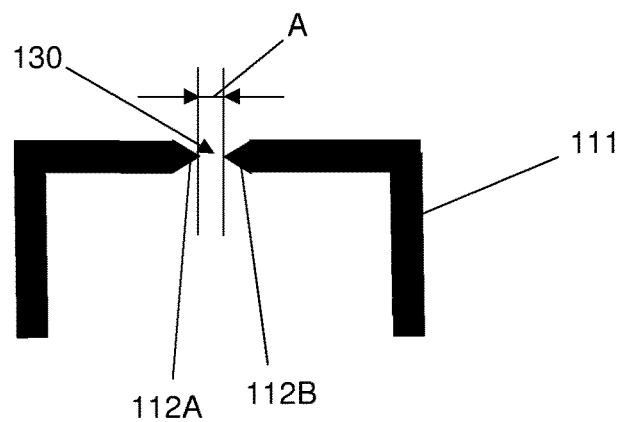
FIG. 2 shows a detailed view of the magnetic conducting track of the force sensor of FIG. 1.

This magnetic conducting track 111 has an interruption 130, wherein the two ends of the magnetic conducting track 112A, 112B are arranged at a distance A from each another, and their two ends 112A, 112B taper in their cross-sections (see FIG. 2). Due to this tip or arrow-shaped formation of the two ends 112A, 112B of the magnetic conducting track 111, particularly strong magnetic field lines are established in this area, whereby a more precise measurement of a possible change in the distance A between the two ends 112A, 112B and, hence, of a possible change in the magnetic field between the two ends 112A, 112B is rendered possible.

In order to minimize influences, in particular magnetic and/or electromagnetic influences from the environment, the force sensor 100 according to the invention additionally comprises, in this embodiment of the invention, a compensation measuring circuit 210 with a magnetic conducting track 211, which compensation measuring circuit is likewise provided with a second excitation magnet 220. The magnetic fluxes of the two magnetically active measuring circuits 110, 210 are measured relative to each other another via a measuring chip 300.

Figure 3:
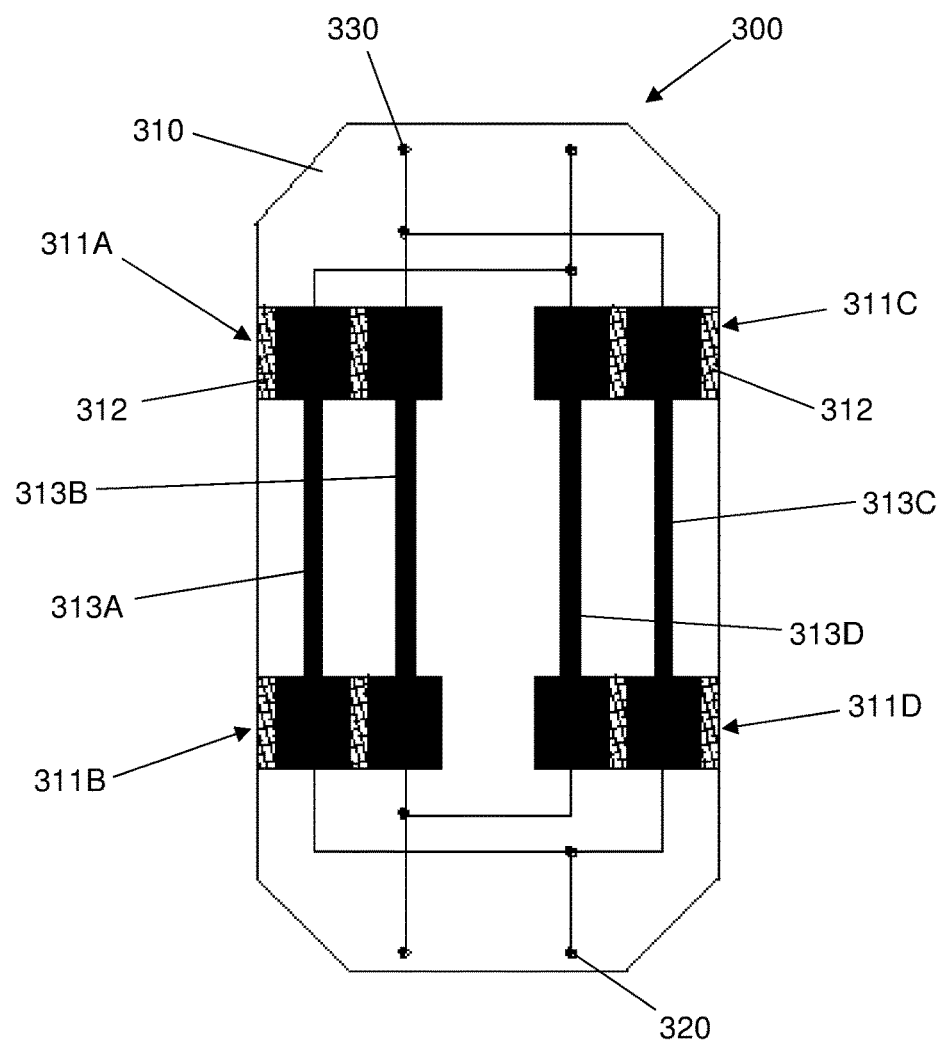
FIG. 3 shows a detailed view of the measuring chip of FIG. 1.

Said measuring chip 300 is depicted in detail in FIG. 3. It is applied to an electrically insulating base 310 in order to electrically insulate it from the metal ground, namely the component to be monitored. This electrically insulating base 310 is made, for example, of ceramic, plastic, mica or similar insulating materials.

The magnetic conductor 111 of the magnetic measuring circuit 110 couples with its two second ends to the two magnetic inputs 311A, 311B of the measuring chip 300. For this purpose, the two inputs 311A, 311B have a magnetic coupling by means of ferrite 312 along with a concurrent electrical insulation. Between the two inputs 311A, 311B, two magnetic measuring sections 313A, 313B are provided, which serve for monitoring the interruption 130 having the distance A of the magnetic conductor 111.

Also for the compensation circuit 210, magnetic inputs 311C, 311D are provided on the measuring chip 300, which, in turn, are interconnected via two measuring sections 313C, 313D.

Finally, connections 320 for supplying the measuring chip 300 with electric current and signal outputs 330 for evaluating the obtained measuring signals are provided.

The mode of operation of the force sensor 100 according to the invention can be described as follows:

During the monitoring of a component on which the force sensor 100 is applied, both the magnetic measuring circuit 110 and the compensation circuit 210 have a constant magnetic field. However, if a deformation of the component occurs in the region of the interruption 130 of the magnetic measuring circuit 110, the distance A of the interruption 130 and thus the induced magnetic field change, with the resulting change in the magnetic flux in the measuring circuits 110, 210 being detected via the measuring sections 313A, 313B, 313C, 313D. This change in the magnetic flux can be analysed in an appropriate evaluation electronics (not shown), and, for example, a warning regarding the stability of the component can optionally be issued.

Figure 4:
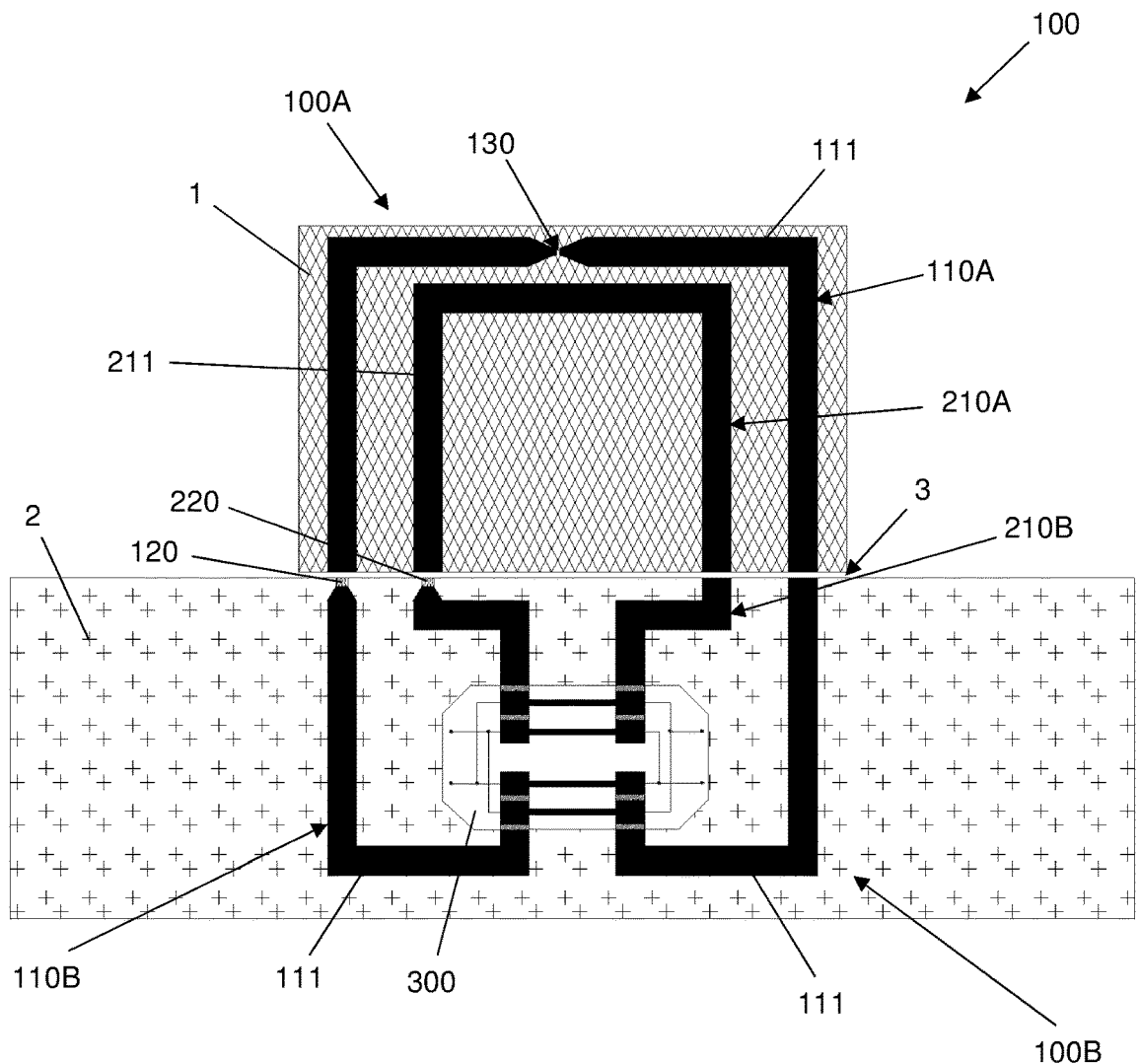
FIG. 4 shows a schematic illustration of the layer structure of the force sensor of FIG. 1.

A further embodiment of the force sensor 100 according to the invention is depicted in FIG. 4. In this case, the force sensor 100 has a two-part design, with a first part, the monitoring part 100A, being arranged on a component 1 to be monitored. A second part, the measuring part 100B of the force sensor 100, is arranged on a second component 2 spaced apart from the first component 1 via a gap 3.

The external magnetic measuring circuit 110 rests with a first part 110A, the magnetic conducting track 111 of which comprises the interruption 130, on the component 1 to be monitored, whereas its second part 110B is arranged with an excitation magnet 120 on the component 2. Similarly, the internal magnetic compensation circuit 210 has a two-part design, namely with a first part 210A being arranged on the first component 1 and with its second part 210B being arranged with its conducting track 211 on the second component 2. In each case, the conducting tracks 111, 211 end in the measuring chip 300.

This two-part structure of the force sensor 100 according to the invention with two interruptions, namely the interruption 130 of the magnetic conducting track 111 and the gap 3, across two components 1, 2 allows monitoring of a possible deformation of the first component 1. In this case, as already described above, the distance A in the interruption 130 and thus the magnetic flux within the force sensor 100 change with a deformation of the first component 1. At the same time, however, the position of the two components 1, 2 relative to each other is also monitored. Since the two excitation magnets 120, 220 are arranged on the second component 2 in close proximity to the conducting tracks 111, 112 on the first component 1, the magnetic flux changes again when the gap 3 between the two components 1, 2 is enlarged or reduced, or else the position of the first component 1 shifts in relation to the second component 2, without their mutual distance being changed.

Figure 5:
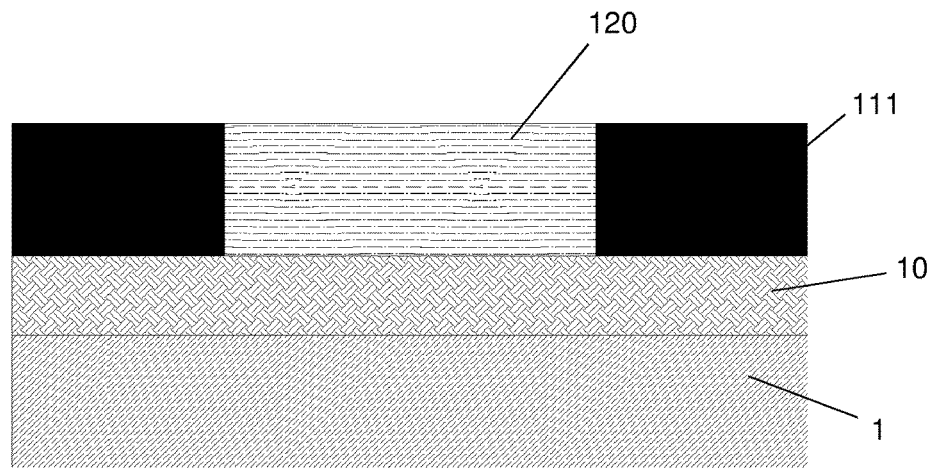
FIG. 5 shows a schematic view of a second embodiment of the force sensor according to the invention.

If the component 1 to be monitored is produced from a magnetic material, it is necessary to apply the magnetic measuring circuit 110 and optionally the compensation circuit 210 on this component 1 in an insulated manner. In a further embodiment of the invention—as illustrated in FIG. 5—it is provided for this purpose that a non-magnetic insulating layer 10 made of, for example, copper, tin, zinc or an alloy of those elements, but also of a non-magnetic alloy of ferrous metals with phosphorus, is applied by means of galvanic methods. Subsequently, the magnetic measuring circuit 110 with the associated excitation magnet 120 is also electrodeposited on this non-magnetic layer 10.

The invention claimed is:

1. A magnetic force sensor comprising at least one conducting track of soft magnetic material and a magnetic compensation circuit, wherein the at least one conducting track has at least one interruption having a distance (A), wherein the magnetic compensation circuit includes at least one excitation magnet, wherein the force sensor is arranged on a substrate and wherein a change in the distance (A) and a change in the magnetic flux, respectively, in the at least one magnetic conducting track is monitored.

2. A force sensor according to claim 1, further comprising a magnetic barrier layer of non-magnetic material.

3. A force sensor according to claim 1, further comprising at least one excitation magnet which is a permanent magnet or an electromagnet.

4. A force sensor according to claim 1, further comprising at least one measuring device for monitoring the magnetic flux within the at least one conducting track.

5. A force sensor according to claim 4, wherein the at least one measuring device is designed as a measuring chip with at least one internal magnetic measuring section.

6. A force sensor according to claim 1, wherein the at least one magnetic conducting track with the at least one interruption and the at least one measuring device form a magnetic measuring circuit.

7. A force sensor according to claim 6, wherein the at least one excitation magnet is formed as part of the magnetic measuring circuit.

8. A method of manufacturing a force sensor comprised of at least one conducting track of soft magnetic material, wherein the at least one conducting track has at least one interruption having a distance (A), wherein the force sensor is arranged on a substrate and a change in the distance (A) and a change in the magnetic flux, respectively, in the at least one magnetic conducting track is monitored, the method comprising:
 applying by means of electrodeposition at least one magnetic conducting track having at least one interruption to a substrate, involving a distance (A);
 electrodepositing a permanently magnetic alloy selected from a group comprising cobalt-nickel-phosphorus, cobalt-nickel-manganese-phosphorus, cobalt-nickel-rhenium-phosphorus, iron-platinum, cobalt-platinum, and bismuth-manganese, on the substrate; and
 incorporating permanently magnetic micro- or nanoparticles into a non-magnetic, metallic matrix during the electrodeposition on the substrate.

9. A manufacturing method according to claim 8, wherein the at least one magnetic conducting track consists of a soft magnetic alloy.

10. A manufacturing method according to claim 8, wherein prior to the application of the at least one conducting track, the method further comprising applying a non-magnetic layer to the base material.

11. A force sensor according to claim 3, wherein the permanent magnet is made of a hard magnetic alloy or a non-magnetic matrix with incorporated permanently magnetic particles.

12. A magnetic force sensor comprising:
 at least one conducting track of soft magnetic material, wherein the at least one conducting track has at least one interruption having a distance (A), wherein the force sensor is arranged on a substrate and a change in the distance (A) and a change in the magnetic flux, respectively, in the at least one magnetic conducting track is monitored; and
 at least one measuring device for monitoring the magnetic flux within the at least one conducting track, wherein the at least one measuring device is designed as a measuring chip with at least one internal magnetic measuring section, wherein the measuring chip includes two or four internal magnetic measuring sections.

13. A manufacturing method according to claim 9, wherein the soft magnetic alloy is a nickel-iron alloy.

14. A manufacturing method according to claim 10, wherein the non-magnetic layer is selected from copper, tin, zinc, or an alloy of two or more of those elements or is a non-magnetic alloy of iron metals with phosphorus.

15. A force sensor according to claim 12, wherein the measuring chip is arranged on an electrically insulating carrier.

16. A manufacturing method according to claim 10, wherein the base material is the component to be monitored.

17. A method of manufacturing a force sensor comprised of at least one conducting track of soft magnetic material, wherein the at least one conducting track has at least one interruption having a distance (A), wherein the force sensor is arranged on a substrate and a change in the distance (A) and a change in the magnetic flux, respectively, in the at least one magnetic conducting track is monitored, the method comprising applying by means of electrodeposition at least one magnetic conducting track having at least one interruption to a substrate, involving a distance (A), wherein the at least one magnetic conducting track consists of a soft magnetic alloy, wherein the soft magnetic alloy is a nickel-iron alloy.

* * * * *